(12) United States Patent
Kim

(10) Patent No.: US 8,189,341 B2
(45) Date of Patent: May 29, 2012

(54) DISPLAY APPARATUS AND METHOD FOR REDUCING ELECTROMAGNETIC INTERFERENCE THEREOF

(75) Inventor: Ju-yong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 374 days.

(21) Appl. No.: 12/060,969

(22) Filed: Apr. 2, 2008

(65) Prior Publication Data

US 2009/0091902 A1 Apr. 9, 2009

(30) Foreign Application Priority Data

Oct. 4, 2007 (KR) .................. 10-2007-0099916

(51) Int. Cl.
*H05K 1/18* (2006.01)
(52) U.S. Cl. ...................... 361/761; 361/748
(58) Field of Classification Search .......... 361/760, 361/761, 748; 439/97, 782, 75
See application file for complete search history.

(56) References Cited

U.S. PATENT DOCUMENTS

| | | | | |
|---|---|---|---|---|
| 4,929,185 A | * | 5/1990 | Wong et al. | ............ 439/74 |
| 6,665,025 B2 | * | 12/2003 | Lee | ............ 349/59 |
| 7,378,794 B2 | | 5/2008 | Kim | |
| 2004/0061998 A1 | * | 4/2004 | Ko | ............ 361/683 |
| 2005/0079748 A1 | | 4/2005 | Kim | |
| 2005/0110407 A1 | | 5/2005 | Kim | |
| 2006/0288139 A1 | * | 12/2006 | Lee et al. | ............ 710/62 |
| 2010/0061041 A1 | * | 3/2010 | Chen | ............ 361/679.01 |

FOREIGN PATENT DOCUMENTS

| | | | |
|---|---|---|---|
| CN | 1629909 A | | 6/2005 |
| KR | 10-2005-0036267 A | | 4/2005 |
| KR | 1020050036267 | * | 4/2005 |
| KR | 10-2005-0050836 A | | 6/2005 |
| KR | 1020050050836 | * | 6/2005 |
| KR | 10-2006-0022174 A | | 3/2006 |

OTHER PUBLICATIONS

Chinese Office Action issued on Jul. 4, 2011 in the corresponding Chinese Patent Application No. 200880110073.9.

* cited by examiner

*Primary Examiner* — Yuriy Semenenko
(74) *Attorney, Agent, or Firm* — Sughrue Mion, PLLC

(57) ABSTRACT

A display apparatus including a circuit board and a surface grounded portion which is disposed on an end portion of the circuit board and formed of a conductive layer. The display apparatus may include a signal receiver mounted on the circuit board, the signal receiver receiving a signal. The display apparatus may include a signal processor mounted on the circuit board, the signal processor processing signals received by the signal receiver.

14 Claims, 3 Drawing Sheets

DISPLAY APPARATUS AND METHOD FOR REDUCING ELECTROMAGNETIC INTERFERENCE THEREOF

CROSS-REFERENCE TO RELATED APPLICATIONS

This application claims priority from Korean Patent Application No. 10-2007-99916, filed on Oct. 4, 2007, in the Korean Intellectual Property Office, the disclosure of which is incorporated herein by reference in its entirety.

BACKGROUND OF THE INVENTION

1. Field of the Invention

Methods and apparatuses consistent with the present invention relate to a display apparatus and a method for reducing electromagnetic interference thereof, and more particularly, to a display apparatus which expands a grounded area provided on a circuit board, thereby reducing electromagnetic interference, and a method for reducing electromagnetic interference thereof.

2. Description of the Related Art

Display apparatuses such as a liquid crystal display (LCD) are used to display an image on a TV, a laptop computer, a desktop computer or other device known in the art. The display apparatus such as a LCD may be generally connected to an external device in a wireless or wire manner.

Such a display apparatus comprises a printed circuit board (PCB). The PCB has a signal processing element, a storage element, and a microcomputer for controlling operation of the display apparatus located thereon and is also provided with a pattern which serves as a passage allowing signals to be transceived among the respective elements.

In particular, the PCB may be affected by its own noise and by electromagnetic interference from other elements, and thus causes a malfunction of the display apparatus. That is, if the display apparatus is connected to an external device through a connector provided on the PCB in a wire manner or if the connector is brought into contact with the PCB, an electromagnetic interference (EMI) noise is generated and thus causes a malfunction such as noise on a display scene of the display apparatus.

The EMI noise is more frequently generated in a cable connector which is connected to a connector disposed at a cable connected to an external device such as a personal computer. In order to reduce the EMI noise, a conventional display apparatus uses an auxiliary device such as a gasket or a shield cover. However, this auxiliary device increases a manufacturing cost of the display apparatus.

Also, there has been a demand for a display apparatus which is capable of reducing an EMI noise and also reducing a manufacturing cost.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a display apparatus which expands a grounded area, thereby reducing an EMI noise and also reducing a manufacturing cost of the display apparatus, and a method for reducing an EMI noise thereof.

According to an aspect of the present invention, there is provided a display apparatus including a circuit board and a surface grounded portion which is disposed on an end portion of the circuit board and formed of a conductive layer.

The display apparatus may include a signal connector mounted on the circuit board, the signal connector receiving a signal, and the signal connector comprising a surface grounded area disposed on an area where the signal connector contacts with the circuit board, the surface grounded area being formed of a conductive material.

The surface grounded portion may be provided on an end portion of the circuit board such that the surface ground portion and the surface ground area contact with each other.

The display apparatus may further include a hole grounded area which is disposed on the circuit board and has a hole to fix the signal connector to the circuit board.

The surface grounded portion may be disposed on an end portion of an area of the circuit board except for an area where the hole grounded area is disposed, to reduce the electromagnetic interference.

A plurality of surface grounded portions may be disposed on the circuit board and have different sizes.

The signal connector may be brought into contact with the circuit board and may be a cable connector to receive a signal transmitted from the outside.

The cable connector may be at least one of a digital video interface (DVI), a high definition multimedia interface (HDMI), and a display port.

According to another aspect of the present invention, there is provided a circuit board including a signal connector which is screwed to the circuit board through a hole defined on the circuit board, and a hole grounded portion which is disposed around the holes of the circuit board; and a surface grounded portion, the surface grounded portion being disposed on an end portion of the circuit board except for the hole grounded portion.

The signal connector may be brought into contact with the circuit board and may be a video cable connector to receive a video signal transmitted from the outside.

The video cable connector is a digital video interface (DVI).

A plurality of surface grounded areas may be disposed on the circuit board and have different sizes.

Another aspect of the invention is a display device comprising a connector which transmits and receives data from an external source, a processor which processes the received data, a display unit which outputs the processed data and a circuit board. The circuit board comprises a first area including a plurality of contact portions that contact with the connector. A a second area located is the proximity of one end portion of the circuit board. The second area includes at least one ground portion extending in a longitudinal direction along the end portion and in a parallel relationship with the plurality of contact portions.

The connector may include at least one grounded area configured to be mated with the at least one ground portion of the circuit board.

The at least one ground portion may be configured to form at least one circular ground portion surrounding at least one retaining hole to receive at least one positioning lever of the connector.

The connector may be at least one of a digital video interface (DVI), a high definition multimedia interface (HDMI), and a display port.

According to another aspect of the present invention, there is provided a circuit board disposed in an imaging forming device, including a first area including a retaining hole to receive at least one positioning lever of a connector which transmits and receives data with respect to an external device. A second area includes at least one ground contact extending in a longitudinal direction along an end portion of the circuit board and in parallel to the plurality of contact portions. The at least one ground contact is formed of a conductive material to reduce electromagnetic interference.

BRIEF DESCRIPTION OF THE DRAWINGS

Above and other aspects of the present invention will become apparent and more readily appreciated from the following description of the exemplary embodiments, taken in conjunction with the accompany drawings of which.

DETAILED DESCRIPTION OF EXEMPLARY EMBODIMENTS

Figure 1:
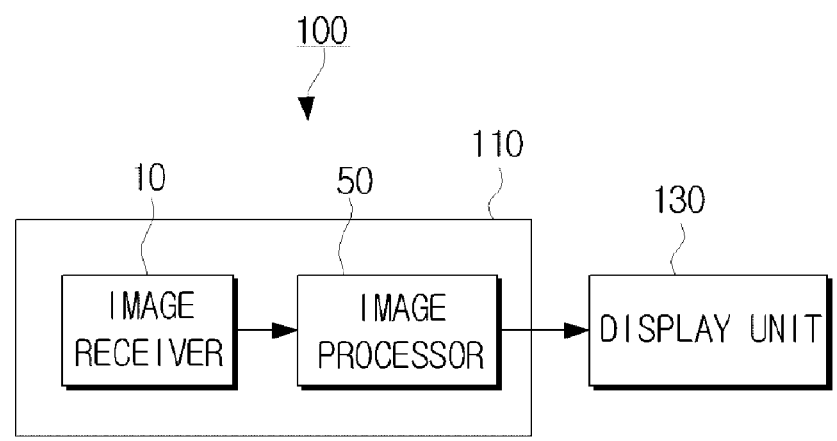
FIG. 1 is a block diagram illustrating a display apparatus according to an exemplary embodiment of the present invention.

Certain exemplary embodiments of the present invention will be described in greater detail with reference to the accompanying drawings.

In the following description, the same drawing reference numerals are used for the same elements even in different drawings. The matter defined in the description, such as detailed construction and elements, are provided to assist in a comprehensive understanding of the invention. Thus, it is apparent that the exemplary embodiments of the present invention can be carried out without this specifically defined matter. Also, well-known functions or constructions are not described in detail since they would obscure the invention with unnecessary detail.

FIG. 1 is a block diagram illustrating a display apparatus according to an exemplary embodiment of the present invention. In this exemplary embodiment, receiving of an image signal from the outside and signal-processing of the received image signal will be mainly described for the convenience of explanation. Accordingly, the image connector 10 and the image processor 50 in the exemplary embodiment correspond to the signal receiver and signal processor of the present invention.

Referring to FIG. 1, a display apparatus 100 according to an exemplary embodiment of the present invention comprises a display unit 130, a circuit board 110, and a image connector 10 and a image processor 50 which are provided on the circuit board 110.

The circuit board 110 is disposed in the display apparatus 100 to support respective elements disposed on the circuit board 110 and also serve as a passage to allow video signals and control signals to be transceived among the elements. An example of the circuit board 110 may be a printed circuit board (PCB).

The image connector 10 is in contact with the circuit board 110 and transmits signals received from the outside to the image processor 50 through a pattern formed on the circuit board 110. One example of the image connector 10 is a connector that connects the display apparatus 100 to an external device (not shown). The connector may be a digital connector, such as a digital video interface (DVI) and a digital port, which transmits and receives digital signals. However, this should not be considered as limiting. The connector may be an analog connector such as a D-SUB which transmits and receives analog signals, or a high definition multimedia interface (HDMI) which receives an image and a sound simultaneously.

The image processor 50 scales an image signal input from the image connector 10, and outputs the scaled image signal to the display unit 130.

Figure 2:
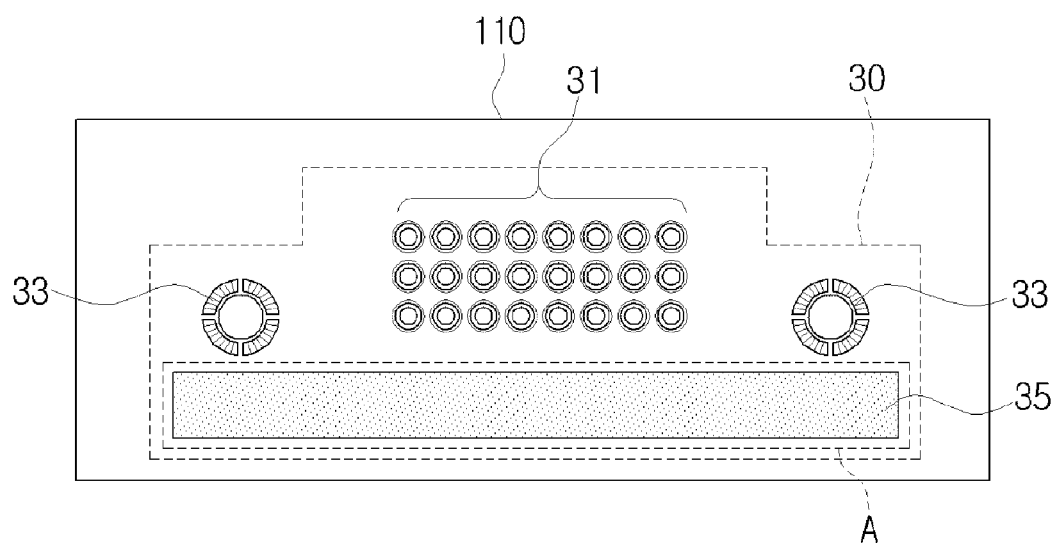
FIG. 2 is a view illustrating a connection unit through which an image connector is brought into contact with a circuit board according to an exemplary embodiment of the present invention.

FIG. 2 is a view illustrating a connection unit through which the image connector 10 is brought into contact with the circuit board 110 according to an exemplary embodiment of the present invention. FIG. 2 illustrates a connection unit on the circuit board 110, which is a part of the circuit board 110.

Referring to FIG. 2, a connection unit 30 according to an exemplary embodiment of the present invention is disposed on the circuit board 110 to bring the image connector 10 into contact with the circuit board 110, and comprises a connector holder 31, a first grounded portion 33, and a second grounded portion 35.

The connector holder 31 comprises a plurality of holders which are disposed on the circuit board 110 corresponding to a plurality of connector holder pins 11 disposed on the image connector 10 (hereinafter, referred to as a "connector"). The connector holder pins 11 disposed on the connector 10 are brought into contact with the connector holder 31 such that the connector 10 is brought into contact with the circuit board 110 and thus outputs image signals received from the outside to the circuit board 110. That is, by connecting the connector holder pins 11 to the connector holder 31, the image signals received from the outside are transmitted to respective elements provided on the circuit board 110 through the pattern formed on the circuit board 110.

The first grounded portion 33 is provided on the connection unit 30 according to the standard for electromagnetic interference (EMI), and reduces an EMI noise which may be generated if the connector 10 is brought into contact with the circuit board 110 or if a cable (not shown) or an external device (not shown) is connected to the connector 10. The grounded portion 33 has a fixing screw hole defined in a center thereof according to the standard for EMI to fix the connector 10 to the circuit board 110.

The second grounded portion 35 is formed of a conductive material and reduces the EMI noise again, which has been once reduced by the first grounded portion 33. The second grounded portion 35 is disposed on the connection unit 30 under the first grounded portion 33, and has a larger size than that of the first grounded portion 33 but the size of the second grounded portion 35 is smaller than a pre-set reference size. The second grounded portion 35 extends in a longitudinal direction along the end portion and in a parallel relationship with the connector holder 31.

More specifically, the second grounded portion 35 is disposed on an end portion A of the circuit board 110, and connects the EMI, which may be generated if the connector 10 is brought into surface contact with the circuit board 110, to ground, thereby reducing the EMI below the standard for EMI. The end portion A of the circuit board 110 is formed on an edge of the circuit board 110 as shown in FIG. 2.

The second grounded portion 35, which is of a conductive layer, is formed by, for example, covering the circuit board 110 with the connection unit 30 formed of a non-conductive material, forming a pattern on the connection unit 30, and removing the area of the second grounded portion 35 from the non-conductive connection unit 30.

Alternatively, the second grounded portion 35 is formed by covering the circuit board 110 with the non-conductive connection unit 30 except for the area where the second grounded portion 35 is to be formed, forming a pattern on the connection unit 30, and coating the area where the second grounded portion 35 is to be formed with a conductive material.

Figure 3:
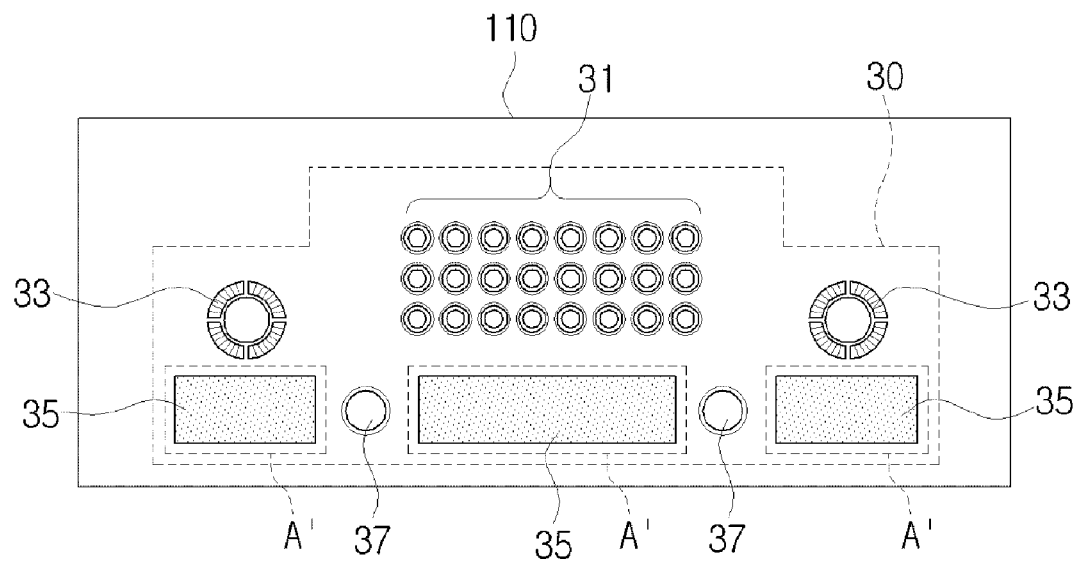
FIG. 3 is a view illustrating a connection unit through which an image connector is brought into contact with a circuit board according to another exemplary embodiment of the present invention.

Also, a plurality of second grounded portions 35 may be provided on end portions A' of the circuit board 110 as shown in FIG. 3. The plurality of second grounded portions 35 may differ from one another in size or have the same size. In this case, a plurality of fixing holes 37 may be defined between the plurality of second grounded portions 35 to fix the connector 10 to the circuit board 110. FIG. 3 illustrates a connection unit 30 which is a part of the circuit board 110 according to another exemplary embodiment of the present invention.

Figure 4:
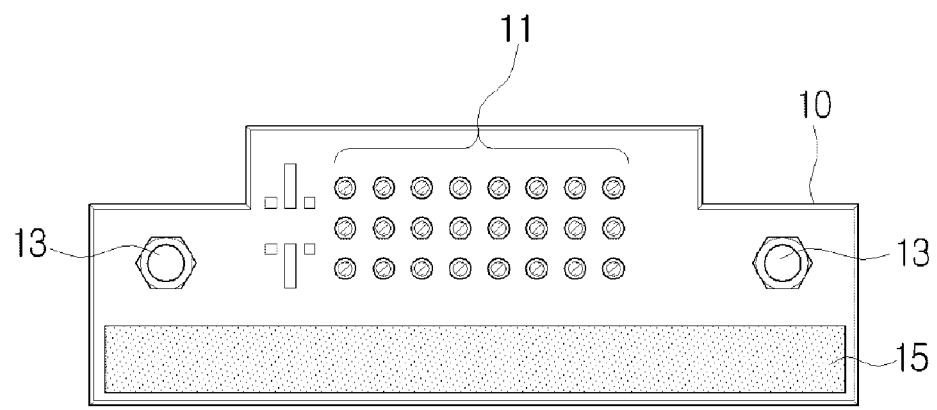
FIG. 4 is a view illustrating a connector according to an exemplary embodiment of the present invention.

FIG. 4 is a view illustrating a connector according to an exemplary embodiment of the present invention.

Referring to FIG. 4, a connector 10 according to an exemplary embodiment of the present invention comprises a connector holder pin 11, a fixing screw 13, and a grounded area 15.

The connector holder pin 11 is disposed on the connector 10 and is brought into contact with the connector holder 31 disposed on the circuit board 110 if the connector 10 is brought into contact with the circuit board 110. For this, the connector holder pin 11 corresponds to the connector holder 31 to bring the connector 10 into contact with the circuit board 110.

The fixing screw 13 is provided on the connector 10 according to the standard for EMI, and fixes the connector 10 to the circuit board 110 when the connector 10 is brought into contact with the circuit board 110. The fixing screw 13 passes through the fixing screw hole of the first grounded portion 33 disposed on the circuit board 110, thereby fixing the connector 10 to the circuit board 110.

The grounded area 15 is formed of a conductive layer and is disposed on the connector 10 corresponding to the second grounded portion 35 disposed on the circuit board 110. That is, the grounded area 15 is disposed on an area of the connector 10 which corresponds to the area of the second grounded portion 35 on the circuit board 110 if the connector 10 is brought into contact with the circuit board 110. The grounded area 15 extends in a longitudinal direction along an end portion and in a parallel relationship with the connector holder pin 11

The grounded area 15 is formed by coating the area of the connector 10 corresponding to the area of the second grounded portion 35 with a conductive material, and like the second grounded portion 35, connects the EMI which may be generated in the circuit board 110 and the connector 10 to ground, thereby reducing the EMI.

Figure 5:
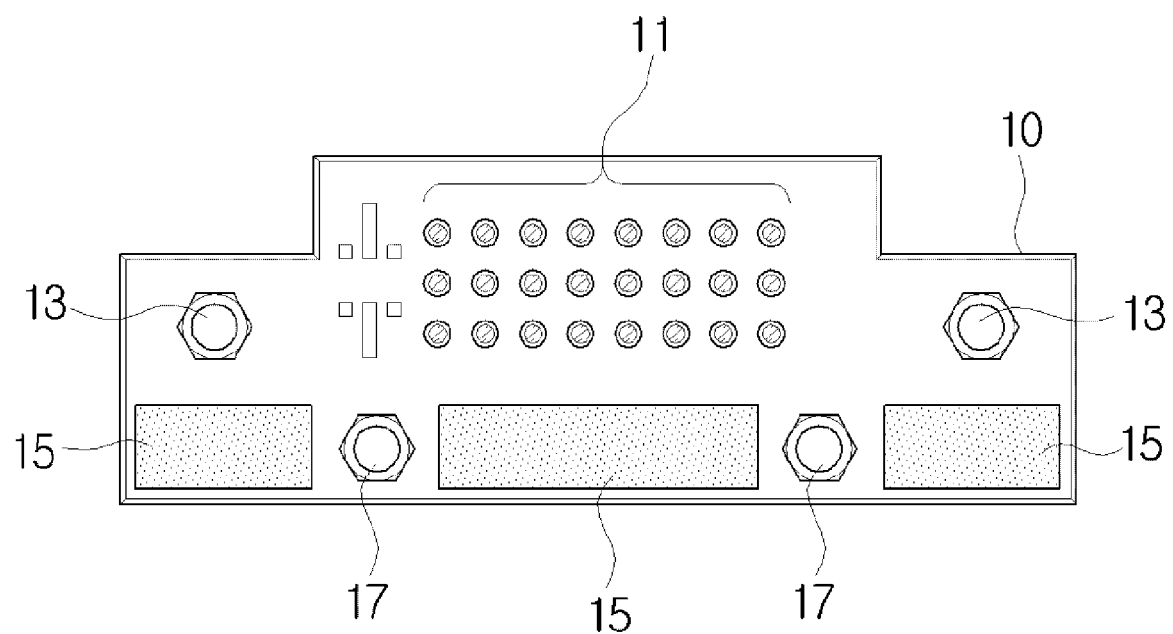
FIG. 5 is a view illustrating a connector according to another exemplary embodiment of the present invention.

Also, according to another exemplary embodiment of the present invention, a plurality of grounded portions 15 are disposed on the connector 10 as shown in FIG. 5. The plurality of grounded portions 15 differ from one another in size and may have the same size. The plurality of grounded portions 15 disposed on the connector 10 corresponds to the plurality of second grounded portions 35 disposed on the circuit board 110.

Also, in this embodiment where the plurality of grounded portions 15 are provided, fixing protrusions 17 are disposed between the grounded portions 15, for fixing the connector 10 to the circuit board 110. The fixing protrusions 17 are disposed on the connector 10 corresponding to the fixing holes 37 of the circuit board 110. The fixing protrusions 17 have a similar shape to a screw and are fixedly attached to the connector 10.

As the second grounded portion 35 increases in its size, an amount of EMI reduced by the second grounded portion 35 increases. Therefore, the second grounded portion 35 must not be formed to have a size smaller than a reference size, and the second grounded portion 35 may extend over the connection unit 30 in a lengthwise direction.

In the above embodiments, the second ground portion 35 and the grounded area 15 disposed on the circuit board 110 and the connector 10, respectively, correspond to each other. That is, the second grounded portion 35 and the grounded area 15 are respectively disposed on the circuit board 110 and the connector 10 in such a manner that the second grounded portion 35 and the grounded area 15 are brought into contact with each other when the connector 10 is brought into contact with the circuit board 110.

In the connector 10 according to the exemplary embodiments of the present invention, the fixing screw 13 is bright into contact with the circuit board 110 through a molding portion on the connector 10, and a grounded area is formed inside the molding part of the connector 10 corresponding to a hole grounded area of the circuit board 110 so that the EMI generated at the circuit board 110 can be reduced. That is, the grounded area is disposed around the fixing screw 13 of the connector 10, and the molding portion covers the grounded area around the fixing screw 13 such that the grounded area around the fixing screw 13 is not bright into direct contact with the hole grounded area of the circuit board 110.

In the display apparatus and the method for reducing EMI according to the exemplary embodiments of the present invention, an example of the first grounded portion 33 is a hole grounded area having a hole defined in a grounded area, and an example of the second grounded portion 35 is a surface grounded area having no hole. However, this should not be considered as limiting. The second grounded portion 35 may be a grounded area having a circular, a triangular, a rectangular, or a polygonal shape, or a grounded area having a point or a line.

Also, in the above embodiments, the method for reducing EMI is applied to the display apparatus. However, this should not be considered as limiting. Any video apparatus having a digital connector can adopt the method for reducing the EMI. That is, the present invention is applicable to a digital video disk (DVD) player, a personal computer (PC), a liquid crystal display (LCD) monitor, a projector, a digital camera, a digital camcorder, a set-top box (STB), a digital television, and an electronic device using an HDMI connector.

As described above, by expanding a grounded area at the connector connecting area provided on the circuit board 110, the EMI can be reduced at the circuit board 110 without using an auxiliary device.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A display apparatus comprising:
   a circuit board;

a surface grounded portion which is disposed on an end portion of the circuit board and formed of a conductive layer;

a connector mounted on the circuit board, the connector receiving a signal, and the connector comprising a surface grounded area disposed on an area where the connector contacts with the circuit board, the surface grounded area being formed of a conductive material; and a hole grounded area which is disposed on the circuit board, and has a hole through which the connector is fixed to the circuit board;

wherein the hole grounded area is disposed on an area of the circuit board that is outside the surface grounded area.

2. The display apparatus as claimed in claim 1, wherein the surface grounded portion is provided on an end portion of the circuit board such that the surface ground portion and the surface ground area contact with each other.

3. The display apparatus as claimed in claim 1, wherein a plurality of surface grounded portions are disposed on the circuit board.

4. The display apparatus as claimed in claim 1, wherein the connector is a cable connector to receive a signal transmitted from the outside.

5. The display apparatus as claimed in claim 4, wherein the cable connector is at least one of a digital video interface (DVI), a high definition multimedia interface (HDMI), and a display port.

6. A circuit board comprising:
a connector which is screwed to the circuit board through a hole defined on the circuit board;
a hole grounded portion which is disposed around the hole defined on the circuit board; and
a surface grounded portion disposed on an end portion of the circuit board that is outside the hole grounded portion,
wherein the surface grounded portion is in direct contact with a surface grounded area of an image connector.

7. The circuit board as claimed in claim 6, wherein a plurality of surface grounded areas are disposed on the circuit.

8. The circuit board as claimed in claim 6, wherein the connector is a video cable connector to receive a video signal transmitted from the outside.

9. The circuit board as claimed in claim 8, wherein the video cable connector is a digital video interface (DVI).

10. A display device comprising:
a connector which transmits and receives data from an external source;
a processor which processes the received data;
a display unit which outputs the processed data; and
a circuit board comprising:
a first area including a plurality of contact portions arranged in at least one row that contact with the connector; and
a second area located in the proximity of one end portion of the circuit board, the second area including a first ground portion, which is outside of the first area, and extends in a longitudinal direction along the end portion and in a parallel relationship with the at least one row of the plurality of contact portions;
wherein the second area includes a second ground portion that is circular and surrounds at least one retaining hole that receives at least one fixing screw of the connector.

11. The display device as claimed in claim 10, wherein the connector comprises at least one grounded area which connects with the at least one ground portion of the circuit board.

12. The display apparatus as claimed in claim 10, wherein the connector is at least one of a digital video interface (DVI), a high definition multimedia interface (HDMI), and a display port.

13. A circuit board disposed in a display device, comprising:
a first area including a plurality of contact portions arranged in at least one row and a grounded retaining hole that receives at least one fixing screw of a connector which transmits and receives data from an external device; and
a second area including at least one ground contact, which is separate from the ground retaining hole, and extends in a longitudinal direction along an end portion of the circuit board and in parallel to the at least one row of the plurality of contact portions,
wherein the at least one ground contact is formed of a conductive material and is in direct contact with at least a grounded area of the connector.

14. The circuit board as claimed in claim 13, further comprising a plurality of ground contacts each having a different size than each other.

* * * * *